United States Patent
Lin et al.

(10) Patent No.: US 9,407,206 B2
(45) Date of Patent: Aug. 2, 2016

(54) PHASED ARRAY ARCHITECTURE CONFIGURED FOR CURRENT REUSE

(75) Inventors: Saihua Lin, Sunnyvale, CA (US); Roger Brockenbrough, Los Gatos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 603 days.

(21) Appl. No.: 13/454,667

(22) Filed: Apr. 24, 2012

(65) Prior Publication Data
US 2013/0278316 A1      Oct. 24, 2013

(51) Int. Cl.
*H03D 7/16* (2006.01)
(52) U.S. Cl.
CPC ..................................... *H03D 7/165* (2013.01)
(58) Field of Classification Search
CPC ...................................................... H03D 7/165
USPC ......................................... 327/237, 238, 254
See application file for complete search history.

(56) References Cited

U.S. PATENT DOCUMENTS

| | | | |
|---|---|---|---|
| 7,260,418 B2 | 8/2007 | Natarajan et al. | |
| 7,679,216 B2 | 3/2010 | Grewing et al. | |
| 7,760,833 B1 | 7/2010 | Brunner | |
| 7,961,025 B2 | 6/2011 | Rylov | |
| 8,295,798 B2 | 10/2012 | Wang et al. | |
| 2010/0099372 A1* | 4/2010 | Wang et al. | 455/313 |
| 2011/0001539 A1 | 1/2011 | Choksi et al. | |
| 2011/0293048 A1* | 12/2011 | Ali et al. | 375/344 |
| 2012/0155573 A1* | 6/2012 | Pruvost | 375/302 |

FOREIGN PATENT DOCUMENTS

| | | |
|---|---|---|
| EP | 2544366 A1 | 1/2013 |
| WO | 9405078 A1 | 3/1994 |
| WO | 0019653 A1 | 4/2000 |
| WO | 2011108103 A1 | 9/2011 |

OTHER PUBLICATIONS

Cohen, et al., "A thirty two element phased-array transceiver at 60GHz with RF-IF conversion block in 90nm flip chip CMOS process," 2010 IEEE Radio Frequency Integrated Circuits Symposium (RFIC), 2010, pp. 457-460.
International Search Report and Written Opinion—PCT/US2013/038076—ISA/EPS—Jul. 25, 2013.
Tabesh, et al., "A 65nm CMOS 4-Element Sub-34mW/Element 60GHz Phased-Array Transceiver," 2011 IEEE International Solid-State Circuits Conference Digest of Technical Papers, ISSCC 2011, pp. 166-168.

(Continued)

*Primary Examiner* — Jeffrey Shin
(74) *Attorney, Agent, or Firm* — James Gutierrez

(57) ABSTRACT

A phased array architecture configured for current reuse is disclosed. In an exemplary embodiment, an apparatus includes a current mode phase rotator (PR) module configured to generate phase shifted in-phase (I) and quadrature-phase (Q) current signals, and a current mode residual sideband (RSB) correction module configured to correct residual sideband error associated with the phase shifted I and Q current signals. The RSB correction module and the PR module form a phased array element configured to reuse a DC supply current.

16 Claims, 7 Drawing Sheets

(56) References Cited

OTHER PUBLICATIONS

Valdes-Garcia, et al., "A Fully Integrated 16-Element Phased-Array Transmitter in SiGe BiCMOS for 60-GHz Communications," IEEE Journal of Solid-State Circuits, vol. 45, No. 12, Dec. 2010, pp. 2757-2773.

Afsahi A., et al., "A Low-Power Single-Weight-Combiner 802.11abg SoC in 0.13 µm CMOS for Embedded Applications Utilizing An Area and Power Efficient Cartesian Phase Shifter and Mixer Circuit", IEEE Journal of Solid-State Circuits, vol. 43, No. 5, May 2008, pp. 1101-1118, ISSN: 0018-9200.

* cited by examiner

PHASED ARRAY ARCHITECTURE CONFIGURED FOR CURRENT REUSE

BACKGROUND

1. Field

The present application relates generally to the operation and design of wireless devices, and more particularly, to the operation and design of phased arrays.

2. Background

A phased array transmitter or receiver comprises multiple phased array elements that work together to transmit or receive information signals. A conventional phased array element may comprise a filter, a mixer and/or additional functional blocks used to provide transmit or receive functions. Typically, each of the functional modules of the phased array element is connected to utilize current from a designated power supply. Accordingly, each module utilizes some amount of power supply current, which defines the overall power consumption. In a portable device, the overall power consumption may significantly impact battery life. Thus, it is desirable to reduce this overall power consumption to extend battery life.

Therefore, what is provided is a phase array element for use in a phased array that is configured for reduced overall power consumption to extend the battery life of portable devices.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
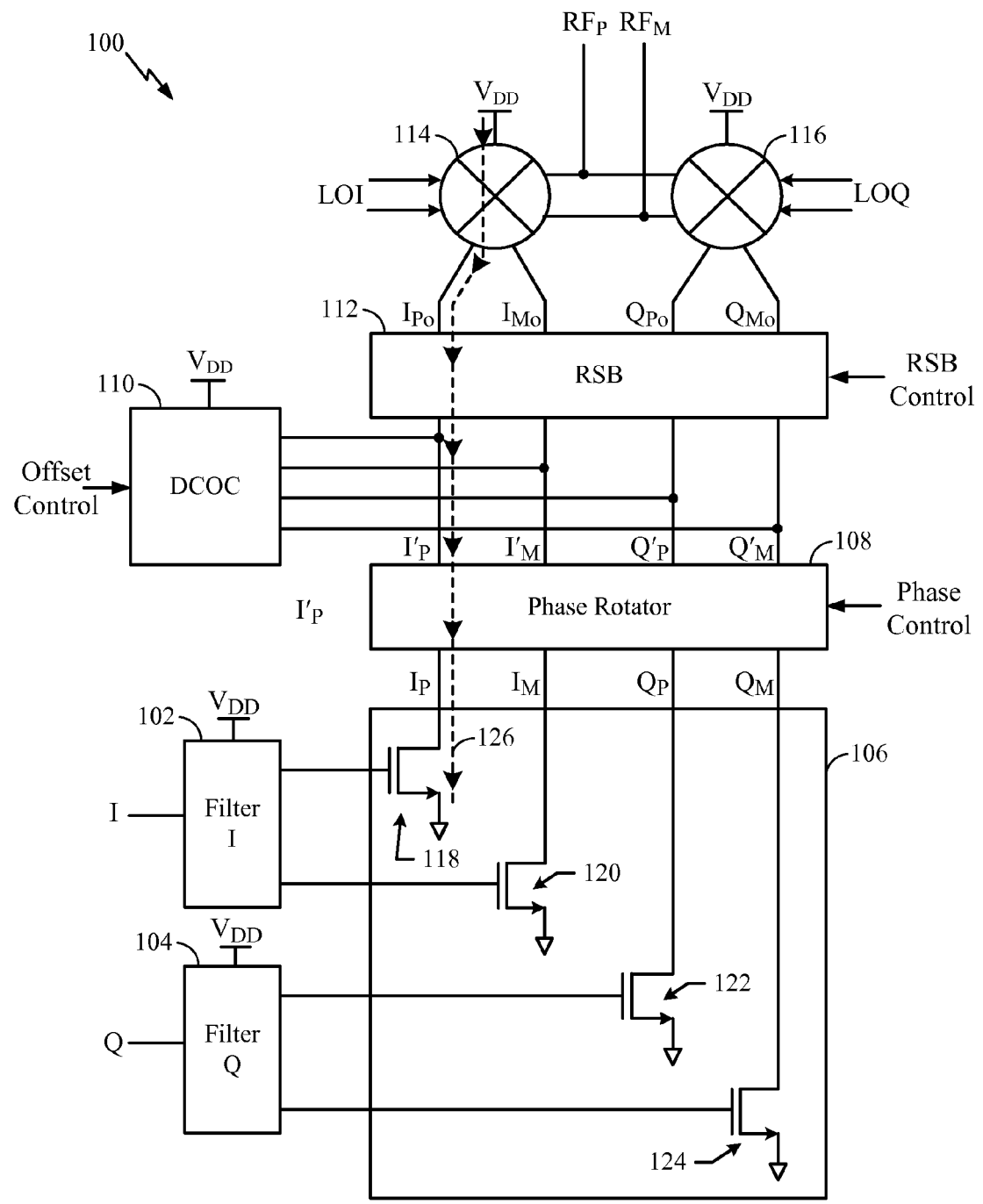
FIG. 1 illustrates an exemplary embodiment of a stacked phased array element for use in a transmitter and that is configured for current reuse.

FIG. 1 illustrates an exemplary embodiment of a stacked phased array element 100 that is configured for current reuse in a phased array transmitter. The phased array element 100 comprises filters 102, 104, gm stage 106, current mode phase rotator 108, DC offset correction (DCOC) block 110, current mode residual side band (RSB) reduction module 112, and mixers 114, 116.

In an exemplary embodiment, the DC offset correction module 110 and the filters 102, 104 are each connected to utilize current from the power supply ($V_{DD}$). The mixers 114, 116, RSB 112, phase rotator 108, and gm stages 106 are stacked to reuse current from a single connection to the $V_{DD}$ supply, and are thereby configured for current reuse. Accordingly, the stacked configuration of the phased array element 100 operates with lower overall current consumption (i.e., lower power) than a conventional phased array element.

In an exemplary embodiment, the filters 102 and 104 are configured to filter I and Q signals to be transmitted. The outputs of the filters 102 and 104 are input to the gm stage 106. The transistors 118, 120, 122 and 124 of the gm stage 106 are connected to receive the voltage based I and Q filter outputs and generate current signals ($I_P$, $I_M$, $Q_P$ and $Q_M$) that are connected to the phase rotator 108.

The phase rotator 108 receives phase control signals to control its operation. The ($I_P$, $I_M$, $Q_P$ and $Q_M$) current signals from the gm stage 106 are connected to the phase rotator 108, which generates the phase rotated output signals ($I_P'$, $I_M'$, $Q_P'$ and $Q_M'$) based on the phase control signals. The outputs ($I_P'$, $I_M'$, $Q_P'$ and $Q_M'$) of the phase rotator 108 are connected to both the DCOC block 110 and the RSB block 112.

The DCOC block 110 operates to remove a DC offset associated with the signals ($I_P'$, $I_M'$, $Q_P'$ and $Q_M'$) based on offset control signals. The RSB block 112 removes the residual sideband in the output signal $RF_P$ and $RF_M$ due to mixer 114, 116 mismatch, LOI, LOQ imperfections, and imperfections in the current signals ($I_{Po}$, $I_{Mo}$, $Q_{Po}$, and $Q_{Mo}$). The mixers 114 and 116 receive local oscillator (LOI and LOQ) signals and upconvert the signals ($I_{Po}$, $I_{Mo}$, $Q_{Po}$, and $Q_{Mo}$) to generate $RF_P$ and $RF_M$ output signals for transmission.

The current path 126 illustrates how current flows through the stacked configuration of the phased array element 100. For example, the mixer 114 is connected to a power supply (VDD) and DC current from this supply flows through the mixer 114, RSB 112, phase rotator 108, and gm stage 106 as illustrated by the current path 126. As a result, the stacked configuration of the phased array element 100 operates to reduce power consumption through DC current reuse.

Figure 2:
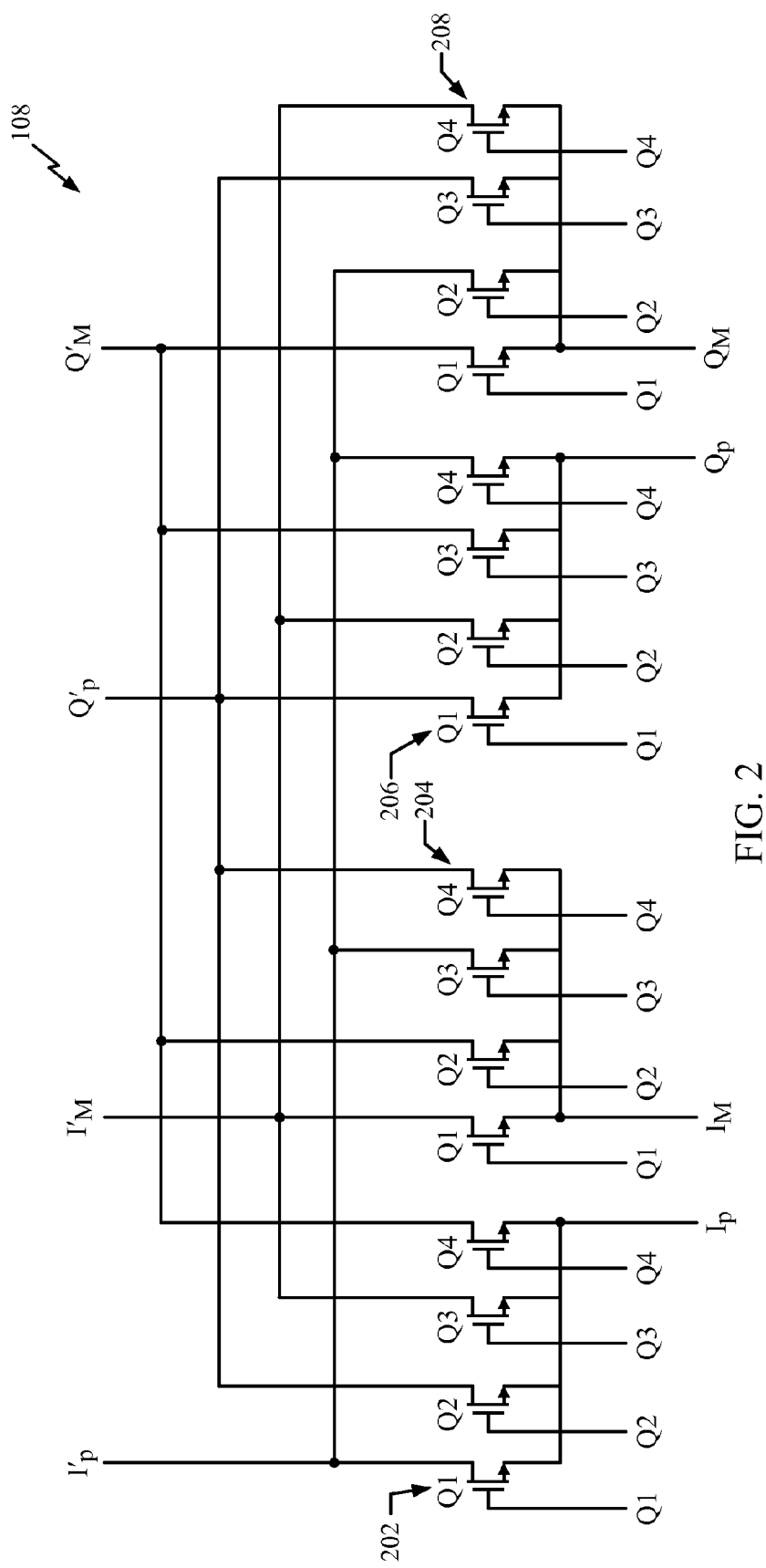
FIG. 2 illustrates an exemplary embodiment of a current mode phase rotator.

FIG. 2 illustrates an exemplary embodiment of the current mode phase rotator 108 shown in FIG. 1. The phase rotator 108 comprises transistor banks 202, 204, 206 and 208 that are connected to the current signal $I_P$, $I_M$, $Q_P$, and $Q_M$ from the gm block 106. The phase rotator 108 generates the current signals $I_P'$, $I_M'$, $Q_P'$ and $Q_M'$ that are connected to the RSB block 112. The phase rotator 108 receives phase control bits Q1, Q2, Q3, and Q4, which represent 0-degrees, 90-degrees, 180-degrees, and 270-degrees of phase shift, respectively. In an exemplary embodiment, the control bits Q1-Q4 are received from a digital baseband controller (not shown).

During operation, only one of the control bits Q1-Q4 are turned on and all the others are turned off. For example, if a 90-degree phase shift is desired, Q2 is set to high and Q1, Q3, Q4 are set to low. This activates the appropriate transistors to provide the desired phase shift.

Figure 3:
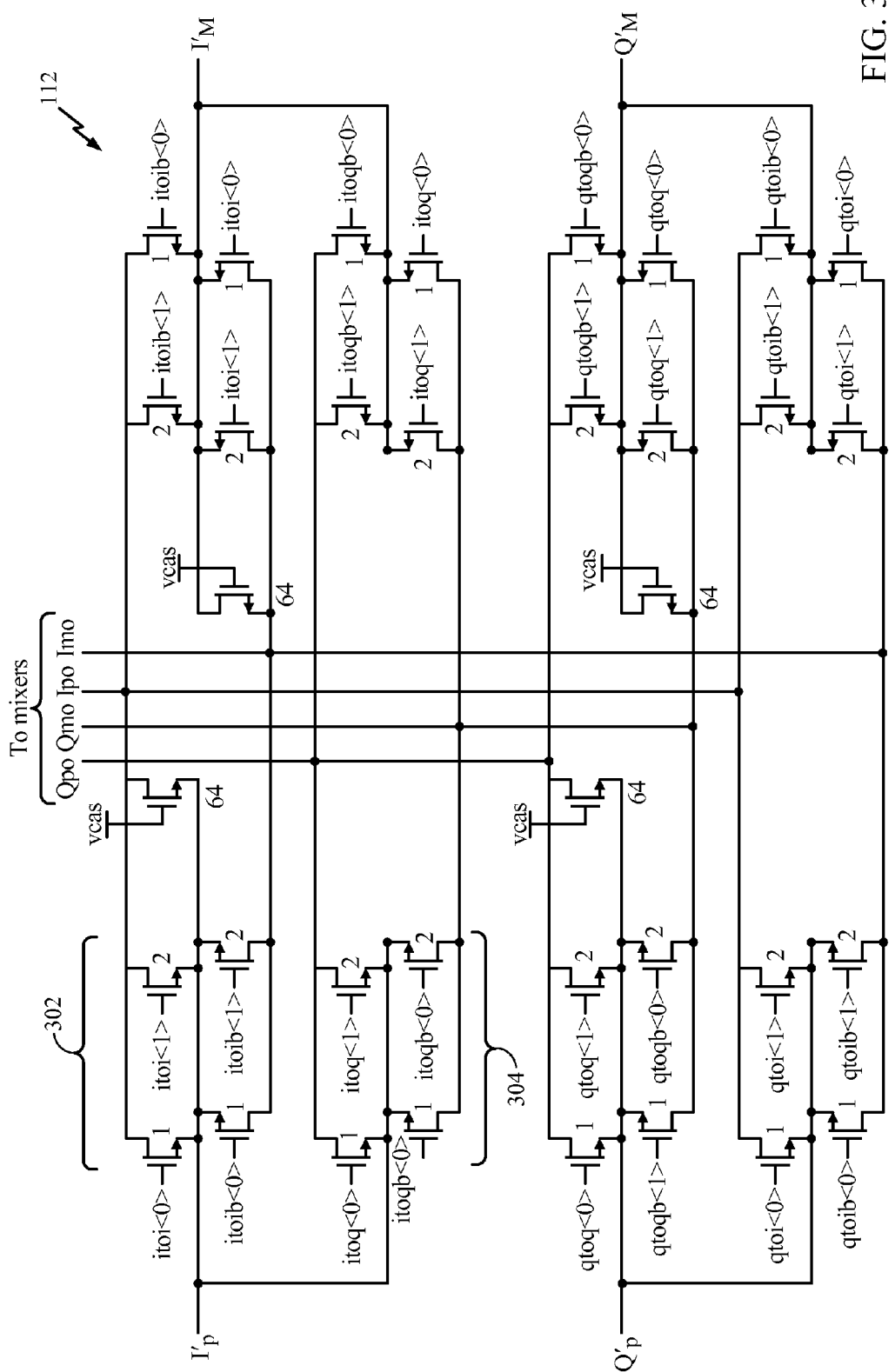
FIG. 3 illustrates an exemplary embodiment of a current mode RSB correction block.

FIG. 3 illustrates an exemplary embodiment of the current mode RSB correction block 112 shown in FIG. 1. The RSB block 112 receives signals ($I_P'$, $I_M'$, $Q_P'$ and $Q_M'$) and performs a correction to generate corrected signals ($I_{Po}$, $I_{Mo}$, $Q_{Po}$, and $Q_{Mo}$) that are input to the mixers 114 and 116. The correction is controlled by the RSB control signals which include (itoi, itoib, itoq, itoqb, qtoq, qtoqb, qtoi, and qtoib) signals. The control signal named itoi means that the signal current, e.g. $I_P'$ will be controlled to flow to the output $I_{Po}$ and the control signal named itoib means that the signal current $I_P'$ will be controlled to flow to $I_{Mo}$. Similarly, the control signal named itoq means the signal current $I_P'$ will be controlled to flow to $Q_{Po}$ while the control signal named itoqb means the signal current $I_P'$ will flow to $Q_{Mo}$. In an exemplary embodiment, the RSB control signals are received from a digital baseband controller (not shown).

The RSB block 112 comprises two transistor banks connected to each of the signals ($I_P'$, $I_M'$, $Q_P'$ and $Q_M'$). For example, the RSB block 112 comprises transistor banks shown generally at 302 and 304 that are associated with the signal $I'_P$. The transistor bank 302 is controlled by control signals (itoi<1:0> and itoib<1:0>) and the transistor bank 304 is controlled by control signals (itoq<1:0> and itoqb<1:0>). The other transistor banks of the RSB block 112 are similarly controlled by designated control signals as shown in FIG. 3. The control signals enable and disable the transistors of each transistor bank to determine the amount of current associated with the signals ($I_P'$, $I_M'$, $Q_P'$ and $Q_M'$).

In an exemplary embodiment, the transistor connected to the most significant bit (MSB) of each control signal has a size that is two times (2×) larger than the transistor connected to the least significant bit (1). One large transistor in each bank has a size that is 64× times the LSB transistor and has a gate terminal connected to vcas, which is always turned on.

Figure 4:
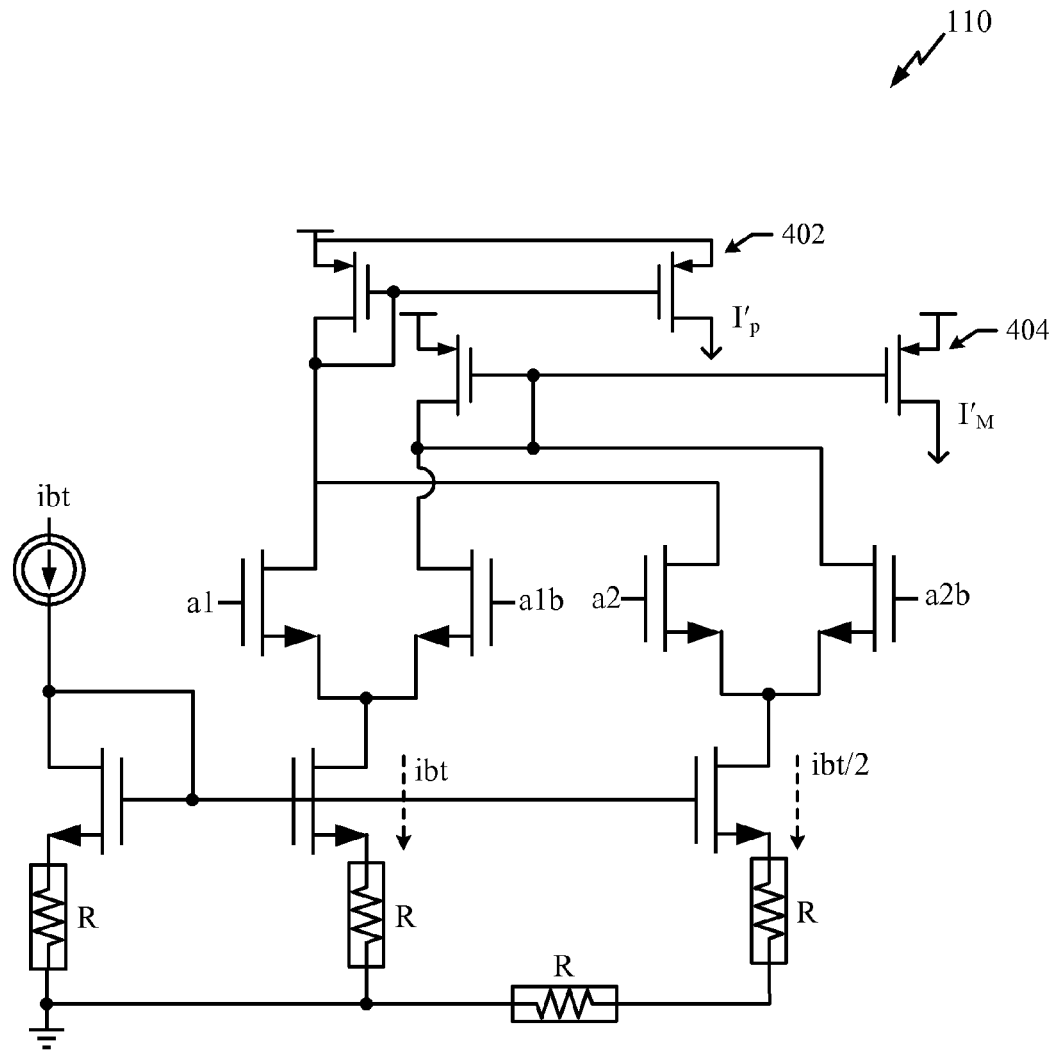
FIG. 4 illustrates an exemplary embodiment of a DC offset correction block.

FIG. 4 illustrates an exemplary embodiment of a DCOC block 110. The DCOC 110 operates to remove a DC offset associated with each of the signals ($I_P'$, $I_M'$, $Q_P'$ and $Q_M'$). For example, a transistor pair 402 is connected to remove a DC offset associated with the $I_P'$ signal, and a transistor pair 404 is connected to remove a DC offset associated with the $I_M'$ signal. Similar circuitry (not shown) is provided by the DCOC block 110 to remove a DC offset from the $Q_P'$ and $Q_M'$ signals.

During operation of the DCOC block 110, a reference source 402 injects a reference current (ibt) into the current mirror. Due to tail resistance R, the mirrored currents are shown as (ibt) and (ibt/2). The offset control signals comprise the signals (a1, a1b, a2, and a2b). In an exemplary embodiment, the offset control signals are received from a digital baseband controller (not shown).

The control signal a1b is the complementary of control signal a1, and the control signal a2b is the complementary of control signal a2. If a1 is high and a2 is low, then a1b is low and a2b is high. The result is that ($I'_P$=ibt) and ($I'_M$=ibt/2).

Figure 5:
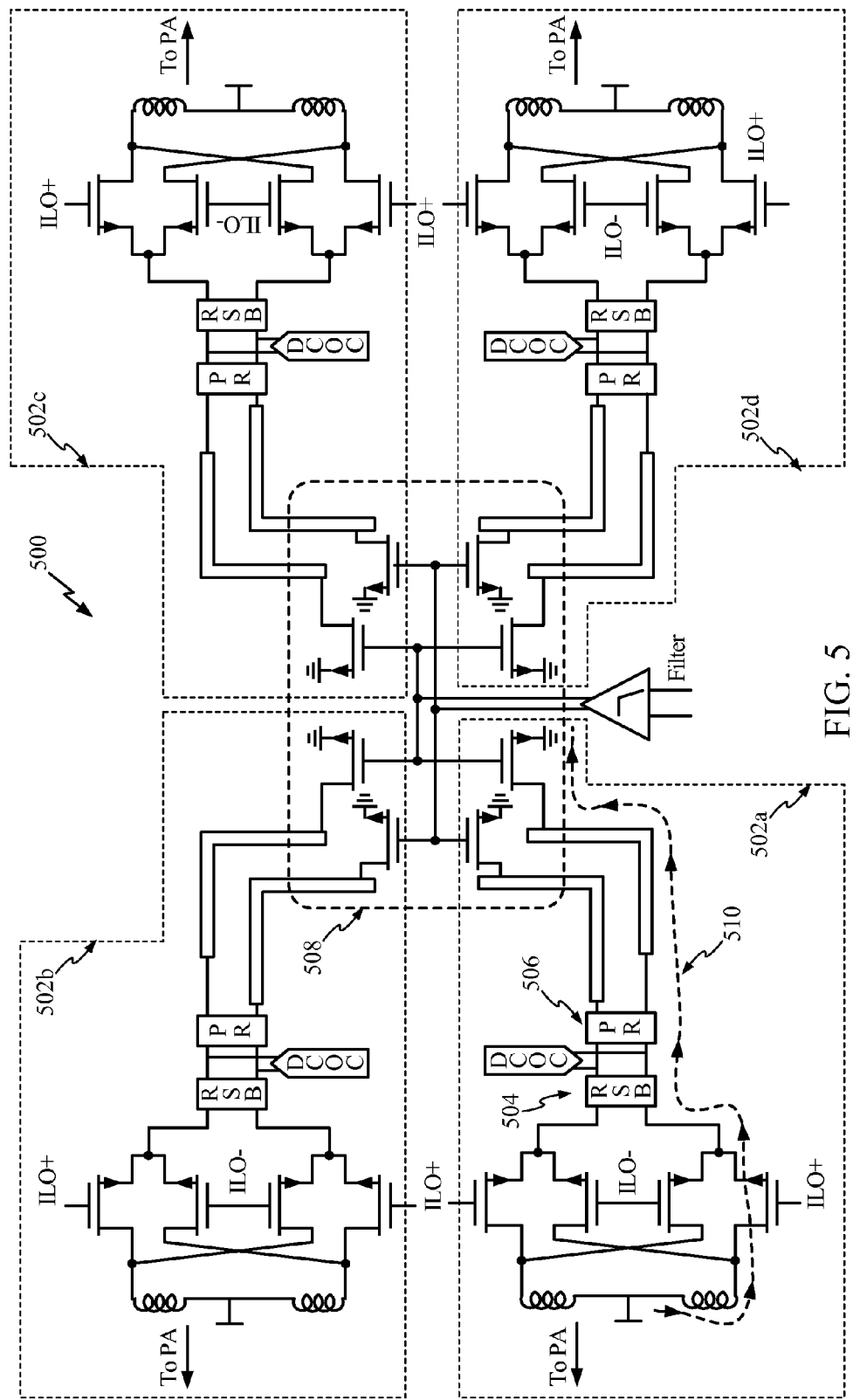
FIG. 5 illustrates an exemplary embodiment of a phased array transmitter comprising four stacked phased array elements.

FIG. 5 illustrates an exemplary embodiment of a phased array transmitter 500 comprising four phased array elements 502a-d. Each array element comprises stacked circuitry configured for current reuse as illustrated by the phased array element 100 shown in FIG. 1. For example, current path 510 illustrates DC current reuse through the array element 502a. As illustrated by path 510, current flows from a $V_{DD}$ supply through mixer 502, RSB 504, phase rotator 506, and gm stage 508. Thus, the current reuse configuration of each of the array elements 502a-d shown in FIG. 5 utilizes less supply current and therefore operates with lower overall power consumption than conventional phased array elements.

Figure 6:
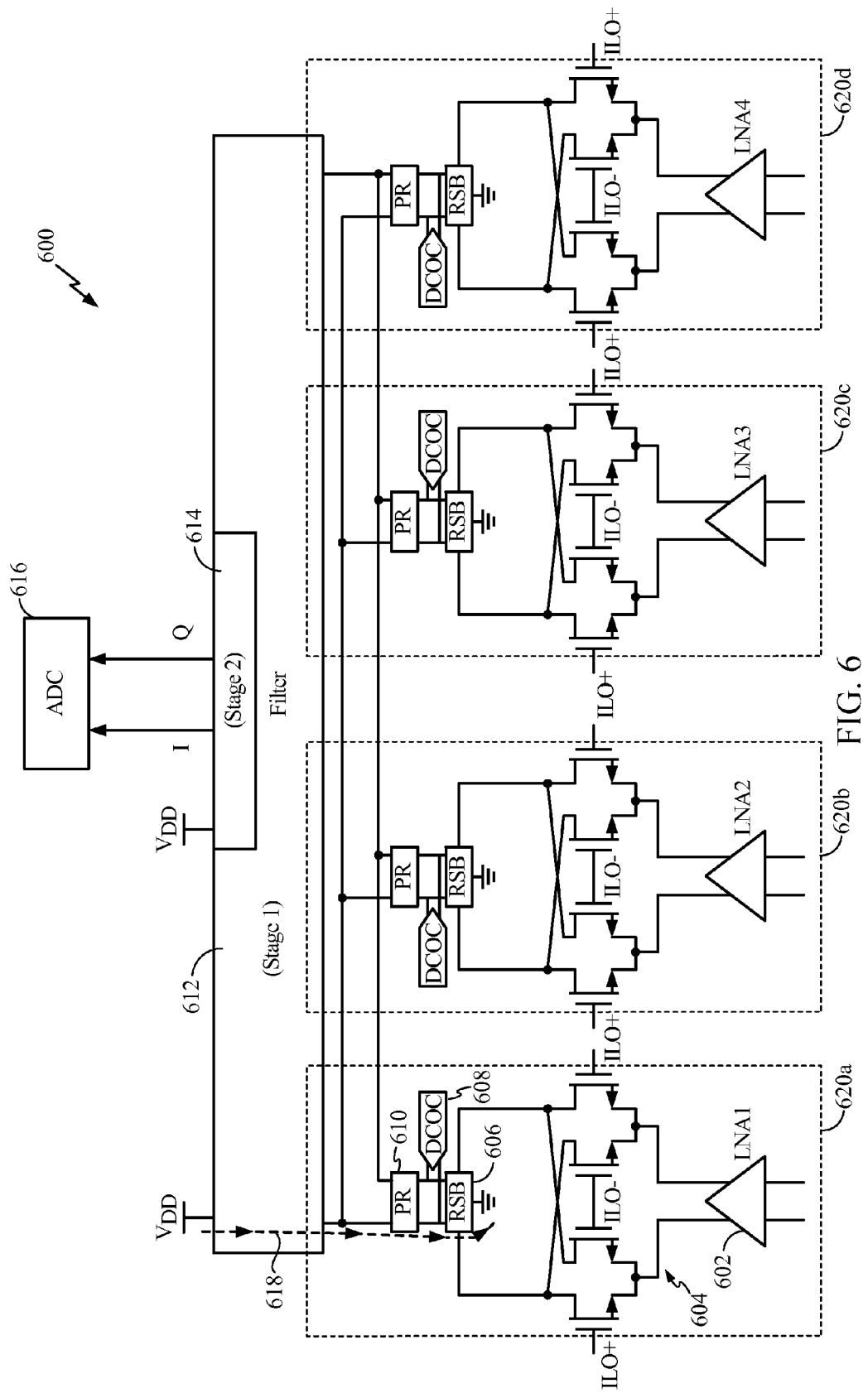
FIG. 6 illustrates an exemplary embodiment of a phased array receiver comprising four stacked phased array elements.

FIG. 6 illustrates an exemplary embodiment of a phased array receiver 600 comprising four array elements 620a-d. Each array element comprises stacked circuitry configured for current reuse as illustrated by the phased array element 100 shown in FIG. 1. For example, the array element 620a comprises an LNA 602, mixer 604, current mode RSB block 606, DCOC 608, and current mode phase rotator 610. The current mode phase rotator 610 is connected to a first filter stage 612 that is further connected to a power supply VDD. The first filter stage 612 is also connected to a second filter stage 614 that also has a connection to the power supply VDD. The output of the second filter stage is connected to an analog-to-digital converter (ADC) 616. The current path 618 illustrates DC current reuse through the array element 620a. As illustrated by path 618, current flows from a $V_{DD}$ supply through the first filter stage 612, phase rotator 610, and RSB block 606. Thus, each of the array elements 620a-d shown in FIG. 6 utilizes less supply current and therefore operates with lower overall power consumption than conventional phased array elements.

Figure 7:
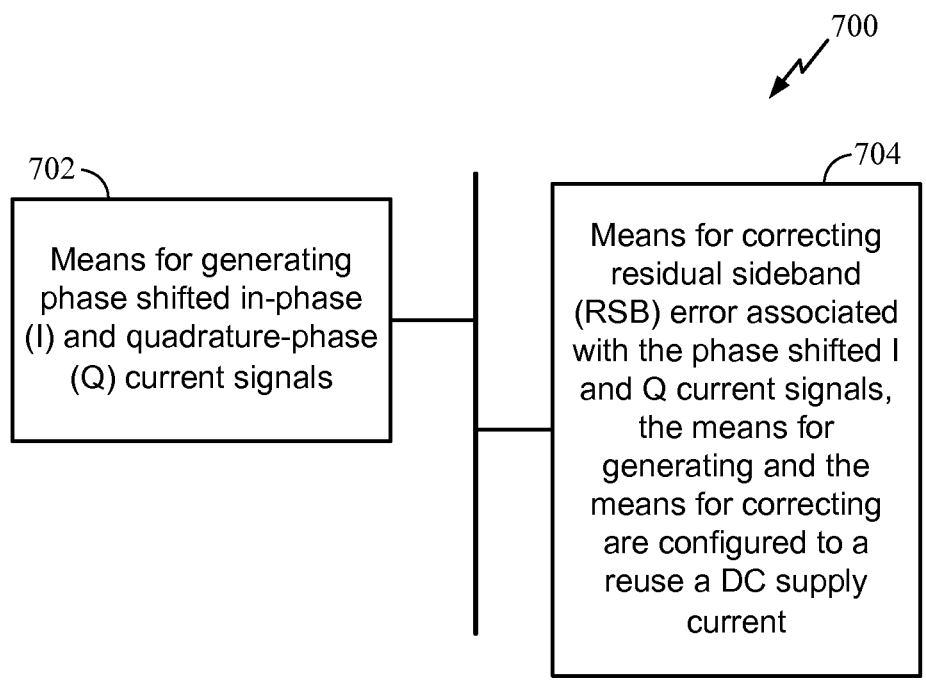
FIG. 7 shows an exemplary embodiment of a stacked phase array apparatus.

FIG. 7 shows an exemplary embodiment of a phase array apparatus 700. For example, the apparatus 700 is suitable for use as the phased array element 100 shown in FIG. 1. In an aspect, the apparatus 700 is implemented by one or more modules configured to provide the functions as described herein. For example, in an aspect, each module comprises hardware and/or hardware executing software.

The apparatus 700 comprises a first module comprising means (702) for generating phase shifted in-phase (I) and quadrature-phase (Q) current signals, which in an aspect comprises the phase rotator 108.

The apparatus 700 also comprises a second module comprising means (704) for correcting residual sideband (RSB) error associated with the phase shifted I and Q current signals; the means for generating and the means for correcting are configured to reuse a DC supply current, which in an aspect, the means for correcting comprises the RSB block 112.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus comprising:
   a current mode phase rotator (PR) module configured to generate phase shifted in-phase (I) and quadrature-phase (Q) current signals; and
   a current mode residual sideband (RSB) correction module configured to correct residual sideband error associated with the phase shifted I and Q current signals, the RSB correction module and the PR module are stacked to use a same current flow from a single connection to a power supply.

2. The apparatus of claim 1, further comprising a gm block configured to generate I and Q current signals that are input to the PR module, the gm block further stacked to use the same current flow from the single connection to the power supply.

3. The apparatus of claim 1, the RSB correction module configured to perform residual sideband correction based on RSB control signals to generate RSB corrected I and Q current signals.

4. The apparatus of claim 3, the RSB correction module comprising at least one transistor bank connected to each of the phase shifted I and Q current signals, respectively, the at least one transistor bank configured to generate the RSB corrected I and Q current signals based on RSB control signals.

5. The apparatus of claim 1, the PR module configured to provide a phase shift based on phase control signals to generate the phase shifted I and Q current signals.

6. The apparatus of claim 5, the PR module comprising a plurality of transistors configured to provide the phase shift based on four phase control signals, and wherein activation of each phase control signal results in a selected phase shift.

7. The apparatus of claim 1, further comprising at least one filter stage coupled to the PR module.

8. The apparatus of claim 1, the RSB correction module coupled to a mixer that upconverts the RSB corrected I and Q signals in a phased array transmitter.

9. The apparatus of claim 1, the RSB correction module coupled to a mixer that downconverts received I and Q signals in a phased array receiver.

10. The apparatus of claim 1, the PR module and the RSB correction module form an array element, the apparatus comprising:
    a plurality of the array elements forming a phased array transmitter, the plurality of array elements configured to transmit I and Q signals.

11. The apparatus of claim 1, the PR module and the RSB correction module form an array element, the apparatus comprising:
    a plurality of array elements forming a phased array receiver, the plurality of array elements configured to receive I and Q signals.

12. The apparatus of claim 1, further comprising a DC offset correction module connected to the PR module and the RSB correction module, the DC offset correction module configured to correct a DC offset associated with the phase shifted I and Q current signals.

13. An apparatus comprising:
 means for generating phase shifted in-phase (I) and quadrature-phase (Q) current signals; and
 means for correcting residual sideband (RSB) error associated with the phase shifted I and Q current signals, the means for generating and the means for correcting are stacked to use a same current flow from a single connection to a power supply.

14. The apparatus of claim 13, further comprising means for converting I and Q voltage signals to I and Q current signals that are input to the means for generating, the means for converting further stacked to use the same current flow from the single connection to the power supply.

15. The apparatus of claim 13, the means for generating and the means for correcting form an array element, the apparatus comprising:
 a plurality of the array elements forming a phased array transmitter, the plurality of array elements configured to transmit I and Q signals.

16. The apparatus of claim 13, the means for generating and the means for correcting form an array element, the apparatus comprising:
 a plurality of array elements forming a phased array receiver, the plurality of array elements configured to receive I and Q signals.

* * * * *